United States Patent
Wilson et al.

(10) Patent No.: US 10,228,401 B2
(45) Date of Patent: Mar. 12, 2019

(54) OSCILLATION ANALYSIS METHOD AND APPARATUS THEREFOR

(71) Applicant: PSYMETRIX LIMITED, Edinburgh, Lothian (GB)

(72) Inventors: Douglas Wilson, Edinburgh (GB); Natheer Al-Ashwal, Edinburgh (GB)

(73) Assignee: PSYMETRIX LIMITED, Edinburgh (GB)

( * ) Notice: Subject to any disclaimer, the term of this patent is extended or adjusted under 35 U.S.C. 154(b) by 572 days.

(21) Appl. No.: 14/771,471

(22) PCT Filed: Feb. 28, 2014

(86) PCT No.: PCT/GB2014/050605
§ 371 (c)(1),
(2) Date: Aug. 28, 2015

(87) PCT Pub. No.: WO2014/132081
PCT Pub. Date: Sep. 4, 2014

(65) Prior Publication Data
US 2016/0003879 A1 Jan. 7, 2016

(30) Foreign Application Priority Data
Mar. 1, 2013 (GB) .................................. 1303735.3

(51) Int. Cl.
*G01R 25/00* (2006.01)
*H02J 3/24* (2006.01)
*G01R 21/00* (2006.01)

(52) U.S. Cl.
CPC .............. *G01R 25/00* (2013.01); *G01R 21/00* (2013.01); *H02J 3/24* (2013.01); *Y02E 60/728* (2013.01); *Y04S 10/265* (2013.01)

(58) Field of Classification Search
CPC ................................. H02J 3/24; Y04S 10/265
See application file for complete search history.

(56) References Cited

U.S. PATENT DOCUMENTS

| 7,490,013 B2* | 2/2009 | Wells ........................ H02J 3/00 324/76.21 |
| 8,898,027 B2* | 11/2014 | Xin ........................... H02J 3/24 700/267 |
| 9,496,715 B2* | 11/2016 | Wilson ...................... H02J 3/24 |

FOREIGN PATENT DOCUMENTS

| WO | 2010/142340 | 12/2010 |
| WO | 2011/061538 | 5/2011 |
| WO | 2011/073670 | 6/2011 |

OTHER PUBLICATIONS

Dong, et al., "Automatic Locating Source Method of Compelled Resonance Low Frequency Oscillation in Power Grid", Chin. Soc. for Elec. Eng., Proceedings of the CSEE, vol. 32, No. 28, Oct. 5, 2012, pp. 68-75.

(Continued)

*Primary Examiner* — Elias Desta
(74) *Attorney, Agent, or Firm* — Liu & Liu

(57) ABSTRACT

The present invention relates to apparatus (10) for determining a contribution of at least one grid subsystem of plural grid subsystems to oscillation in angle or grid oscillation in an electrical grid (12). The apparatus (10) is configured to receive a first quantity which corresponds to oscillation in angle at a first grid subsystem (14). The apparatus (10) is also configured to receive a second quantity which corresponds to oscillation in angle at a second grid subsystem (16). The apparatus (10) comprises a processor (32) which is operative to determine a contribution of at least one of the first and second grid subsystems to oscillation in angle or grid oscillation with the contribution being determined in dependence on a phase relationship between the first and second quantities.

28 Claims, 9 Drawing Sheets

(56) References Cited

OTHER PUBLICATIONS

Gao, et al., "Locating Method of Disturbance Source of Forced Power Oscillation Based on Prony Anyasis", 2012 China International Conference on Electricity Distribution (CICED 2012), Shanghai, Sep. 5-6, 2012, pp. 1-4.

Wuhan, et al., "Disturbance Source Self-Diagnosis of the Smart Grid", IEEE, 2012, pp. 1-4.

Hu, et al., "Disturbance Source Location of Forced Power Oscillation in Regional Power Grid", IEEE, 2011, pp. 363-366.

Duan, et al., "Impact of Load Model on Disturbance Sources Locating Based on Energy Function", Te Bie Tui Jian, Received date Apr. 8, 2012, pp. 16-19.

Ma, et al., "Application of Phasor Measurement Unit on Locating Disturbance Source for Low-Frequency Oscillation", IEEE Transactions on Smart Grid, vol. 1, No. 3, Dec. 2010, pp. 340-346.

Maslennikov, et al., "Locating the Source of Sustained Oscillations in Power Systems Using PMU Data", IEEE PES Transactions on Power Systems, Apr. 13, 2016, pp. 1-7.

McNabb, et al., "Oscillation Source Location in Power Systems Using Logic Regression", IEEE, 2010, pp. 1-8.

McNabb, et al., "Oscillation Source Location using Wavelet Transforms and Generalized Linear Models", IEEE, 2010, pp. 1-9.

Tang, et al., "Research on Forced Oscillations Disturbance Source Locating Through an Energy Approach", International Transactions on Electrical Energy Systems, Int. Trans. Electr. Energ. Syst., Apr. 29, 2015, vol. 26, pp. 192-207.

Yu, et al., "The Disturbance Source Identification of Forced Power Oscillation Caused by Continuous Cyclical Load", IEEE, 2011, pp. 308-313.

Ying, et al, "An Energy-Based Methodology for Locating the Source of Forced Oscillations in Power Systems", IEEE, 2012, pp. 1-6.

\* cited by examiner

OSCILLATION ANALYSIS METHOD AND APPARATUS THEREFOR

FIELD OF THE INVENTION

The present invention relates to a method of and apparatus for determining a contribution of at least one grid subsystem to oscillation in angle in an electrical grid.

BACKGROUND ART

An electrical power network is operative at a nominal line or mains frequency. The nominal frequency is 50 Hz in Europe, 60 Hz in North America and 50 Hz or 60 Hz elsewhere. All electric power systems experience oscillations because of the fundamental dynamic nature of generation and load interconnected through a network. Where, for example, the nominal frequency is 60 Hz grid oscillation may cause the frequency to vary from 60 Hz such as between 59 Hz and 61 Hz with a period of 20 seconds; such variation is, however, an extreme example. Grid oscillation may thus be considered a modulation of a measured signal with another signal of different and normally considerably lower frequency than the nominal frequency. Oscillation in measured frequency implies that there are oscillations in generator rotor angles and consequently the angle component of phasors representing the magnitude and angle of voltage at the fundamental grid frequency.

For example the oscillations may cause the voltage angle to oscillate by an amplitude of 1 degree with a period of 2 seconds.

Grid oscillations arise on account of interactions between and amongst grid subsystems with each of the involved subsystems contributing either positively, negatively or neutrally to the grid oscillation. Of grid subsystems, generators are often significantly involved in grid oscillation on account of generator rotor speed variation. Several mechanisms can result in generators contributing to the energy of an oscillation, including the action of Automatic Voltage Regulators (AVR) and turbine governor regulators. Other control systems, such as Power System Stabilisers (PSS), act to improve the stability of the oscillation by providing damping. Grid oscillations are evident not only from oscillations in the frequency but also from oscillations in the like of line power, voltage angle (which is normally referred to as angle), angle difference between geographically separate parts of the grid, and the speed of rotating machines, such as generators, which form part of the grid. Use of the term voltage angle herein means the representation of a voltage waveform at the fundamental frequency of the grid with respect to a time-synchronised reference as defined by IEEE C37.118 (2005) and in particular in Section 4.2. Grid oscillations are thus evident from variations in the AC electrical characteristics of the affected part of the grid and from variations in the mechanical characteristics of rotating machines comprised in the affected part of the grid.

Grid oscillations can, under certain circumstances, be prejudicial to proper operation of an electrical grid in particular where the grid oscillations are poorly damped if not unstable. Grid oscillations may, for example, cause protection relay tripping which leads to loss of interconnecting lines or loss of load, or generator or turbine stresses. FIG. 1 shows an unstable oscillation in grid frequency that led to system separation and load-shed relay tripping. Considering FIG. 1 more closely, a graph of grid frequency over time is shown which reflects a nominal 60 Hz system oscillating at low frequency with a period of 20 seconds so as to cause variation in the frequency between 59 Hz and 61 Hz.

Grid oscillations often involve and affect many generators in an electrical grid. Furthermore grid oscillations may span boundaries between network areas controlled by different operating companies and may perhaps span national boundaries. It is therefore desirable to identify those grid subsystems that are contributing negatively to grid oscillation so that appropriate action can be taken. Appropriate action may, for example, involve control room initiated real-time generation re-dispatch or planned action such as tuning a controller in a negatively contributing subsystem. Furthermore information on relative contributions of various subsystems to grid oscillation may prove useful in addressing inter-company or indeed international jurisdictional issues arising from the grid oscillation.

The present inventors have appreciated that it is at present difficult to determine to what extent grid subsystems, such as generators or control apparatus, are contributing to grid oscillation, such as by contributing positively or negatively or merely responding to the grid oscillation.

It is therefore an object for the present invention to provide a method of determining a contribution of at least one grid subsystem to oscillation in angle in an electrical grid.

It is a further object for the present invention to provide apparatus for determining a contribution of at least one grid subsystem to oscillation in angle in an electrical grid.

STATEMENT OF INVENTION

According to a first aspect of the present invention there is provided a method of determining a contribution of at least one grid subsystem of plural grid subsystems to oscillation in angle or grid oscillation in an electrical grid, the method comprising:
  receiving a first quantity which corresponds to oscillation in angle at a first grid subsystem;
  receiving a second quantity which corresponds to oscillation in angle at a second grid subsystem; and
  determining a contribution of at least one of the first and second grid subsystems to oscillation in angle or grid oscillation, the contribution being determined in dependence on a phase relationship between the received first and second quantities.

The inventors have appreciated that a contribution of at least one of first and second grid subsystems to oscillation in an electrical grid can be determined in dependence on a phase relationship between a first quantity, which corresponds to oscillation in angle at the first grid subsystem, and a second quantity, which corresponds to oscillation in angle at the second grid subsystem. The method may thus further comprise determining a phase relationship between the first and second quantities. Oscillation in an electrical grid is normally evident as oscillation in angle and as grid oscillations in respect of the like of frequency and power. Oscillation in an electrical grid is thus normally evident in oscillation of plural properties of the electrical grid. The term angle (or voltage angle) refers to the angle component of a phasor representation of the fundamental grid frequency, which may be nominally 50 Hz or 60 Hz. The term phase relationship and phase angle, as used below, relate to oscillations at a different frequency and normally much lower frequency than the fundamental grid frequency, such as 0.003 to 2 Hz versus 50 Hz or 60 Hz. The first and second quantities may be based on a measurable property such as frequency or angle, e.g. voltage angle, such as may be provided by processing of raw measurements. Furthermore the measurable property may be a mechanical property, such as generator rotor angle, although measurement of an electrical property may be more practicable than measurement of a mechanical property. The contribution of at least one of the first and second grid subsystems to oscillation in angle may, for example, be determined in respect of the relative contributions of the first and second grid subsystems or in respect of a measure, such as a damping contribution, of one, other or both of the first and second grid subsystems as is described in more detail below.

The present invention offers several advantages over known approaches to contribution determination. For example the present invention may be operable with a partially observed system, i.e. a system having insufficient measurement apparatus to characterise power flow between grid subsystems and the electrical grid properly. Fully observed systems are, in practice, uncommon. Furthermore and in the normally rarer circumstance where a system is fully observed the present invention may be operable in dependence on a relatively small number of all the available or possible measurements and thereby provide for simplicity. In addition the present invention may offer a simpler and therefore probably computationally less intensive approach to contribution determination on the basis of measurements to hand. Furthermore the present invention may provide for improved resilience to loss of measurements than an approach requiring power flow and is therefore practically more robust.

The first quantity may correspond to oscillation in angle at a first location at the first grid subsystem and the second quantity may correspond to oscillation in angle at a second location at the second grid subsystem. The present invention may be operable in dependence on no measurement being made in respect of the first and second grid subsystems further to measurements at the first and second locations whereby the present invention is operable in a partially observed system. According to one approach the first and second quantities may be based on a same measurable property, such as frequency, angle or power. According to another approach the first and second quantities may be based on different measurable properties. A phase shift between different measurable properties at a same location may be known. A phase angle of a first measurable property at a location may therefore be determined on the basis of a second measurable property at the same location having regards to a phase shift between the first measurable property and the second measurable property. At least one phase shift between different measurable properties may be predetermined or known. For example rotor speed and electrical frequency lead rotor angle, voltage angle and electrical power by substantially 90 degrees. The present invention may therefore and by way of example involve determining the contribution in dependence on a phase relationship between frequency measurement at the first grid subsystem and angle measurement at the second grid subsystem.

According to an example, an electrical power network comprises two grid subsystems. The electrical power network undergoes inter-area mode oscillation whereby the two grid subsystems oscillate substantially 180° degrees out of phase with each other. Inter-area mode oscillation is described further below along with other oscillatory modes. Measurements in respect of each of the two grid subsystems determine that oscillation at a first of the two grid subsystems lags oscillation at the second grid subsystem by less than 180°, which indicates the first grid subsystem to be contributing more than the second grid subsystem to damping of the inter-area mode oscillation. According to another example the two grid subsystems oscillate substantially in phase with each other. Measurements in respect of each of the two grid subsystems determine that oscillation at a first of the two grid subsystems lags oscillation at the second grid subsystem, which indicates the first grid subsystem to be contributing more than the second grid subsystem to damping. The method may therefore comprise determining relative contributions, such as relative damping contributions, of the first and second grid subsystems to oscillation in angle. Determination of relative contributions may be useful, for example, in identifying a grid subsystem which is having a negative effect on electrical power network stability.

It is to be appreciated that the method according to the present invention may be operable with more than two grid subsystems. The method may therefore further comprise: receiving at least one further quantity which corresponds to oscillation in angle at a respective one of at least one further grid subsystem, the at least one further quantity being based on the same measurable property as the first and second quantities; and determining a contribution of at least one of the plural grid subsystems to oscillation in angle in dependence on a phase relationship between and amongst the plural quantities.

The first and second grid subsystems may oscillate substantially in phase. Substantially in phase oscillation may arise where there is common mode oscillation that is substantially in phase throughout an entire interconnected system. Alternatively substantially in phase oscillation may arise in a first part of an electrical power network, which is oscillating substantially 180 degrees out of phase with another part of the electrical power network, with first and second grid subsystems comprised in the first part oscillating substantially in phase with each other. The first and second grid subsystems may be considered to constitute a group within which there is substantially in phase oscillation and which oscillates substantially 180 degrees out of phase to another group in the electrical power network. As described above making a determination in dependence on a phase relationship between first and second quantities, such as oscillations in angle, and hence differences in phase from 0 and 180 degrees constitutes a central feature of the present invention. References herein to substantially in or out of phase oscillations thus involve a fair degree of breadth of interpretation. For example a group of generators may be described as oscillating substantially in phase in so far as their oscillations are within 45 degrees of one another with the invention being operative in dependence on phase differences between and amongst generators in the group within the 45 degree spread. The extent of the breadth of the interpretation of substantially in or out of phase is considered further below with regards to numerical limits. Group wide substantially in phase oscillation may arise in local mode oscillation or inter-area mode oscillation. Local mode oscillations differ from inter-area oscillations with regards to their normally higher frequency. Local mode oscillations are seen in one region of a network whereas inter-area oscillations are seen between large areas of a network and can sometimes be seen throughout the grid. The method may further comprise calculating a contribution of at least one of the first and second grid subsystems in dependence on a phase relationship between the first and second quantities. In addition the contribution of one of the first and second grid subsystems may be calculated in dependence on a difference between the phases of the first and second quantities and more specifically in dependence on the sine of the difference between the phases. Calculation in dependence on the sine of the difference may provide for improved precision of determination of contribution. A determined contribution may then be used to determine the nature of the contribution of a grid subsystem, i.e. positive, negative or neutral. Where plural contributions are determined, the contributions may be compared, e.g. by ranking the contributions, to determine the extent of contribution of the grid subsystems. The contribution in respect of damping of each of plural grid subsystems may be calculated by way of:

$$D_i = \sin(\theta_G - \theta_i)$$

where $D_i$ is the damping contribution at grid subsystem i, $\theta_i$ is the phase angle of oscillations at grid subsystem i and $\theta_G$ is the average oscillation phase angle for the plural grid subsystems.

It is normally desirable to determine the contribution of one or more grid subsystems to oscillation in angle upon a change of damping so that appropriate action may be taken. For example if there is a reduction in damping the present invention may be used to identify one or more grid subsystems that have caused the reduction whereby a dispatch change or controller adjustment can be applied to address the effect of the offending grid subsystem or subsystems. By way of further example the present invention may be used to determine the effect, whether positive or negative, of a controller on damping. It may thus be advantageous to determine if there is a change in damping. The method may therefore comprise determining whether or not there is a change in oscillation in angle and more specifically whether or not there is one of an increase or a decrease in damping of oscillation in angle. Determination of a change in oscillation in angle may require temporally spaced apart measurements. The method may therefore further comprise receiving temporally spaced apart quantities corresponding to characteristics of oscillation in angle, the change in oscillation being determined in dependence on the received temporally spaced apart quantities. The temporally spaced apart quantities may comprise plural first or second quantities. Alternatively the temporally spaced apart quantities may correspond to or be based on measurements other than measurements corresponding to first or second quantities. For example and where the first and second quantities represent voltage angle, the temporally spaced apart quantities may be provided in dependence on power measurements made at a grid location other than at the first and second grid subsystems. Detecting a change in oscillation in angle and an increase or decrease in damping or amplitude may provide for determination of further information with regards to the contribution of at least one grid subsystem, such as whether a contribution is positive or negative or perhaps latencies in respect of grid subsystems.

The method may further comprise comparing each contribution of at least one of the first and second grid subsystems with a respective reference contribution. According to a first approach a reference contribution may reflect a contribution when the electrical grid has a particular damping condition, such as well damped. For example, the reference contribution may be determined in dependence on received quantities which are based on measurements made when the electrical grid is well damped. Alternatively the reference contribution may be determined, e.g. on the basis of simulation or calculation, to reflect a well damped condition or such that contributions for grid subsystems are substantially the same. According to a second approach a reference contribution may comprise a contribution previously determined according to the present invention. Normally the first approach is preferred over the second approach because a difference between a present contribution and a reference contribution may be greater under the first approach, it being noted that determinations of contributions based on ongoing measurements sometimes vary to a comparatively small extent. Also a comparison between a present contribution and a reference contribution determined according to the first approach may contain more useful information than a comparison according to the second approach.

Each of the first and second quantities may comprise at least one characteristic of a property measured at a respective one of the first and second grid subsystems. More specifically each of the first and second quantities may comprise at least one characteristic of an electrical property, such as a voltage and perhaps a frequency of a voltage, measured at a respective one of the first and second grid subsystems. Alternatively each of the first and second quantities may comprise at least one characteristic of an angle measurement, such as voltage angle. Alternatively each of the first and second quantities may comprise at least one characteristic of a measurement of a mechanical property of apparatus comprised in a respective one of the first and second grid subsystems. For example each of first and second quantities may be based on a measurement of rotor angle of a generator comprised in the respective grid subsystem. Each of such mechanical or electrical properties may reflect oscillation in angle and may therefore be measured to provide the first and second quantities. As noted above, measurement of electrical properties may be preferred over measurement of mechanical properties on account of the greater practicability of the former.

The present inventors have appreciated that the mode of oscillation may have a bearing on how a contribution of at least one of the grid subsystems is determined. As mentioned above there are three main oscillatory modes, namely the inter-area mode, the common mode and the local mode. The inter-area mode is characterised by opposing oscillations, i.e. oscillations which are substantially 180° out of phase. The common mode is characterised by non-opposing oscillations, i.e. oscillations which are substantially in phase. Opposing oscillations are present in the local mode but they may, in certain circumstances, be too small to be capable of measurement. In such circumstances non-opposing oscillations may be relied upon.

Where plural grid subsystems are subject to opposing oscillations, for example, as characterising an inter-area mode, the method may further comprise dividing the plural grid subsystems into groups. For example where there are six grid subsystems they may be divided into three groups of two grid subsystems each. According to a first approach the plural grid subsystems may be divided into groups in dependence on the electrical separateness of the plural grid subsystems. The method may comprise determining the electrical separateness of the plural grid subsystems in dependence on measurements made in an electrical power network comprising the plural grid subsystems. The measurements may, for example, comprise current measurements in the electrical power network. According to a second approach the plural grid subsystems may be divided into groups in dependence on the relative directions (or phase relationships) of oscillations of the plural grid subsystems. The directions of oscillation may reflect groupings of oscillations that are substantially in phase and out of phase. The method may therefore comprise determining a direction of oscillation of each grid subsystem of the plural grid subsystem and dividing the plural grid subsystems into groups in dependence on the determined directions. For example two grid subsystems may oscillate in substantially a same first direction and two further grid subsystems may oscillate in substantially a same second direction. Substantially the same direction may, depending on circumstances, be interpreted quite widely. For example substantially the same direction may mean that grid subsystems oscillate in directions less than 90°, 75°, 60°, 45°, 30°, 20°, 10°, 5°, 3°, 2° or 1° of each or one another. Determining a direction of oscillation may comprise analysing oscillation measurements. The second approach may be used in preference to the first approach on account of its greater ease of implementation. Alternatively or in addition both approaches may be used with, for example, the first approach being used to address the like of conflicts or ambiguities arising from use of the second approach. Alternatively or in addition plural grid subsystems may be grouped in dependence on knowledge, e.g. in the form of machine readable data, of electrical power network configuration.

The configuration of an electrical power network may change in respect of the composition of the groups. For example one grid subsystem may be moved from a first group to a second group. The method may therefore comprise re-dividing the plural grid subsystems into groups. Re-division into groups may comprise moving at least one grid subsystem from one group to another. The step of re-dividing the plural grid subsystems into groups may be taken in dependence on reconfiguration of an electrical power network comprising the plural grid subsystems.

The method may further comprise determining a group phase for each group, such as an average phase for the grid subsystems comprised in each group. The average phase may comprise a weighted average phase. Weighting may be in dependence on ratings of generators comprised in a group. For example if one generator is larger than another generator in a group of two generators or the other generators in a larger group more weight may be accorded to the phase for the larger generator.

The method may further comprise calculating a contribution, such as a damping contribution, of at least one group of plural groups in dependence on a relationship between or amongst the group phases of the plural groups. In addition the contribution of at least one group may be calculated in dependence on at least one difference between group phases and more specifically in dependence on a sine of a difference between group phases. Calculation in dependence on a sine of a difference may provide for more precision in determination of contribution. More specifically the contribution of a first group may be calculated in dependence on a sum of differences between the group phase for the first group and the group phase for each of the other groups. The determined contributions may then be used to determine the nature of the contribution of a group, i.e. positive, negative or neutral. Where plural contributions are determined, the contributions may be compared, e.g. by ranking the contributions, to determine the extent of contribution of the groups. Calculation of contribution as thus far described may provide for determination of contribution sufficient for certain circumstances, for example, to determine gross comparative contributions. Improved precision of contribution determination may be achieved as follows in particular where there are at least three groups. A difference between group phases between a first group and each of second and further groups may be adjusted in dependence on an amplitude for one of the groups such as an average amplitude for a group. More specifically a difference determined for a first group with respect to other groups may be adjusted in dependence on an amplitude for a respective one of the second and further groups. The amplitude may be determined in dependence on a measurement in respect of a group, such as in respect of at least one grid subsystem comprised in a group. Use of the amplitude may be advantageous only where there are more than two groups.

A change in voltage angle at a generator or group of generators may give rise to a change in power output from another generator or group of generators. The method may therefore comprise adjusting a difference between group phases between a first group and each of second and further groups in dependence on a sensitivity of the first group to a change in a respective second or further group, i.e. a sensitivity factor. More specifically a sensitivity factor may comprise a sensitivity of power output from the first group in dependence on a change in angle at a respective second or further group. Use of the sensitivity factor may be advantageous only where there are more than two groups. Where groups of generators are electrically closer the impedance between the groups is normally lower and the angle difference is normally smaller. Electrically closer groups normally provide for a greater inter-group sensitivity than groups that are further spaced apart electrically. Generator reactance and step up transformers, which connect generators to the grid, may also have an effect on sensitivity whereby a group comprising larger generators may provide for greater inter-group sensitivity. The method of the present invention may comprise determining a sensitivity factor in dependence on at least one of electrical distance and generator rating. The configuration of an electrical power network may change. For example lines or generators may be connected or disconnected. A change in electrical power network configuration may change a sensitivity factor. The method may therefore further comprise adjusting at least one sensitivity factor in dependence on a change in configuration of an electrical power network comprising the plural groups.

Where differences between group phases are adjusted in dependence on amplitude and sensitivity, the damping contribution for each of the plural groups may be calculated by way of:

$$D_{Gi} = \sum_{j=1}^{n} w_{ij} * a_{Gj} * \sin(\theta_{Gj} - \theta_{Gi})$$

where $D_{Gi}$ is the damping contribution of group i, $w_{ij}$ is the sensitivity of group i to group j, $a_{Gj}$ is the average amplitude for group j, $\theta_{Gj}$ is the average oscillation phase angle for group j and $\theta_{Gi}$ is the average oscillation phase angle for group i.

The method may comprise determining a contribution of at least one grid subsystem in a group. More specifically a contribution may be calculated in dependence on a difference between the phases of quantities for the grid subsystems and more specifically in dependence on the sine of the difference between the phases as is described in further detail above.

Where there are plural groups and an increase in damping, the method may comprise identifying one of the plural groups having a greatest increase in phase relative the others of the plural groups. The identified group may be responsible or may be the most responsible for the increase in damping. This approach may be expanded to identify a second group having a second greatest increase in relative phase and so on whereby contributions from plural groups and their relative extent of contribution may be determined. Where an identified group comprises plural grid subsystems, such as plural generators, the method may comprise identifying one of the plural grid subsystems within the identified group having the greatest reduction in phase relative the other grid subsystems in the identified group. The identified grid subsystem within the identified group may be responsible or be the most responsible for the increase in damping. This approach may be expanded to identify a second grid subsystem having a second greatest reduction in relative phase and so on whereby contributions from the plural grid subsystems and their relative extent of contribution may be determined.

Where there are plural groups and a decrease in damping, the method may comprise identifying one of the plural groups having a greatest reduction in phase relative the others of the plural groups. The identified group may be responsible or may be the most responsible for the decrease in damping. This approach may be expanded to identify a second group having a second greatest reduction in relative phase and so on whereby contributions from plural groups and their relative extent of contribution may be determined. Where an identified group comprises plural grid subsystems, such as plural generators, the method may comprise identifying one of the plural grid subsystems within the identified group having the greatest increase in phase relative the other grid subsystems in the identified group. The identified grid subsystem within the identified group may be responsible or be the most responsible for the decrease in damping. This approach may be expanded to identify a second grid subsystem having a second greatest increase in relative phase and so on whereby contributions from the plural grid subsystems and their relative extent of contribution may be determined.

Where plural grid subsystems are subject to non-opposing oscillations, such as in the common mode, there is normally no need to divide the grid subsystems into groups. The grid subsystems may therefore be treated as being comprised in one group. A contribution of at least one grid subsystem in a group may be determined as described above with regards to calculation in dependence on a difference between phases of quantities for the grid subsystems and more specifically in dependence on the sine of the difference between the phases.

A grid subsystem may comprise at least one electrical apparatus, such as at least one generator or substation. A grid subsystem may therefore comprise plural generators. A grid subsystem comprising plural generators may therefore constitute a 'group' as used herein.

The method may further comprise determining whether oscillations in angle are opposing or non-opposing. More specifically the determination may be made in dependence on analysis of phase of quantities corresponding to oscillations in angle at the first and second grid subsystems, such as the first and second quantities. Opposing oscillations may be characterised by the quantities being substantially or perhaps even merely generally 180° out of phase. Non-opposing oscillations may be characterised by the quantities being substantially or perhaps even merely generally in phase. Common mode oscillations tend to be of very low frequency, such as 0.06 Hz whereas opposing phase oscillations tend to be at a higher frequency albeit at a low frequency, such as between 0.1 Hz and 2 Hz. The determination with regards to opposing or non-opposing oscillations may therefore be made in dependence on analysis of a frequency of oscillations in angle. The method may comprise analysing a quantity, such as one, other or both of the first and second quantities, to determine the frequency. More specifically the determined frequency may be compared with a reference frequency with a determination of common or non-opposing oscillation being made where the determined frequency is less than the reference frequency and a determination of opposing oscillation being made where the determined frequency is more than the reference frequency. The reference frequency may be between substantially 0.1 Hz and substantially 0.2 Hz. Alternatively the determined frequency may be compared with each of first and second reference frequencies, with the first reference frequency being lower than the second reference frequency, such as substantially 0.1 Hz and substantially 0.2 Hz respectively. A determination of common or non-opposing oscillations may be made where the determined frequency is less than the first reference frequency. A determination of opposing oscillations may be made where the determined frequency is more than the second reference frequency. It is to be appreciated that more than one mode of oscillation may be present simultaneously in the electrical grid. An angle measurement may therefore comprise information on more than one mode as well as steady state information of no value to the present invention.

A frequency of oscillation in angle may be less than the system frequency, e.g. less than 50 Hz or 60 Hz. More specifically the frequency of oscillation in angle may be less than substantially 10 Hz, 5 Hz, 1 Hz, 500 mHz, 250 mHz or 100 mHz. Alternatively or in addition the frequency of oscillation in angle may be between substantially 0.003 Hz and substantially 2 Hz.

The reader skilled in the art will appreciate that the terms substantially in phase, substantially 180° out of phase, opposing phase, non-opposing phase and the like may, under certain circumstances, involve a fair degree of breadth of interpretation. Considering substantially in phase oscillation, two signals may be considered substantially in phase if they are in the same phase to within 90°, 75°, 60°, 45°, 30°, 20°, 10° or 5°. Similarly when considering substantially 180° out of phase, two signals may be considered substantially 180° out of phase if they are 180° out of phase to within 90°, 75°, 60°, 45°, 30°, 20°, 10° or 5°.

At least one of the first and second quantities may be received by way of processing apparatus from measurement apparatus, such as at least one phasor measurement unit (PMU). More specifically measurements may be received from the measurement apparatus in processing apparatus which is operative to provide at least one of the first and second quantities. Furthermore the processing apparatus may be operative to determine at least one of oscillation frequency, oscillation amplitude, damping and phase in dependence on measurements received from the measurement apparatus. Alternatively at least one of the first and second quantities may be received having been determined by processing apparatus which is operated in a territory or jurisdiction other than the territory or jurisdiction in which the present invention is used. For example and where the electrical grid spans more than one country at least one of the first and second quantities may be received, e.g. in electronic form, from an operating company in another country. The measurement apparatus may be configured to make measurements at or in the vicinity of a grid subsystem. More specifically the first quantity may be received by way of processing apparatus from a first phasor measurement unit and the second quantity may be received by way of processing apparatus from a second phasor measurement unit. The first and second phasor measurement units may be temporally synchronised with each other. The use of at least one phasor measurement unit may be appropriate where an electrical property is being measured. Where a mechanical property is being measured an alternative form of measurement unit may be employed, such as a measurement unit responsive to rotation.

The step of determining a contribution of at least one of the first and second grid subsystems may be performed in computer apparatus or the like. The step of determining a contribution of at least one of the first and second grid subsystems may therefore be performed by electronic means. At least one of the first and second quantities may be received in computer apparatus or the like before the step of determining a contribution of at least one of the first and second grid subsystems is performed. Therefore at least one the first and second quantities may be received in a machine readable format.

According to a second aspect of the present invention there is provided a computer program comprising program instructions for causing a computer to perform the method according to the first aspect of the present invention.

More specifically the computer program may be one of: embodied on a record medium; embodied in a read only memory; stored in a computer memory; and carried on an electrical carrier signal. Further embodiments of the second aspect of the present invention may comprise one or more features of the first aspect of the present invention.

According to a third aspect of the present invention there is provided a computer system comprising program instructions for causing a computer to perform the method according to the first aspect of the present invention.

More specifically the program instructions may be at least one of: embodied on a record medium; embodied in a read only memory; stored in a computer memory; and carried on an electrical carrier signal. Further embodiments of the third aspect of the present invention may comprise one or more features of the first aspect of the present invention.

According to a fourth aspect of the present invention there is provided apparatus for determining a contribution of at least one grid subsystem of plural grid subsystems to oscillation in angle or grid oscillation in an electrical grid, the apparatus being configured to: receive a first quantity which corresponds to oscillation in angle at a first grid subsystem; and receive a second quantity which corresponds to oscillation in angle at a second grid subsystem, the apparatus comprising a processor which is operative to determine a contribution of at least one of the first and second grid subsystems to oscillation in angle or grid oscillation, the contribution being determined in dependence on a phase relationship between the first and second quantities.

The apparatus may further comprise at least one of: a first measurement unit, such as a PMU, operative to provide measurements for the first quantity; and a second measurement unit, such as a PMU, operative to provide measurements for the second quantity. At least one of the first and second measurement units may be in signal communication with the processor, for example, by way of a copper, optical fibre or wireless link, whereby the processor may receive measurements from a measurement unit. The processor may be operative to provide at least one of the first and second quantities in dependence on received measurements. More specifically the processor may be operative to receive raw measurements and to provide at least one of oscillation frequency, oscillation amplitude, damping and phase in dependence on the received measurements. The processor may, for example, comprise a Wide Area Monitoring System (WAMS), which is operative on the raw measurements.

Alternatively or in addition the apparatus may comprise output apparatus operable to provide an output to a user. More specifically the output apparatus may be operable to provide to the user a phase relationship between the first and second quantities. Alternatively or in addition the output apparatus may be operable to provide to the user at least one determined contribution. More specifically the output apparatus may be operable to provide to the user plural determined contributions whereby the user may determine the nature of the contributions from grid subsystems. Further embodiments of the fourth aspect of the present invention may comprise one or more features of any previous aspect of the present invention.

According to a fifth aspect of the present invention there is provided an electrical grid comprising apparatus according to the fourth aspect of the present invention.

BRIEF DESCRIPTION OF DRAWINGS

Further features and advantages of the present invention will become apparent from the following specific description, which is given by way of example only and with reference to the accompanying drawings, in which.

DESCRIPTION OF EMBODIMENTS

Figure 1:
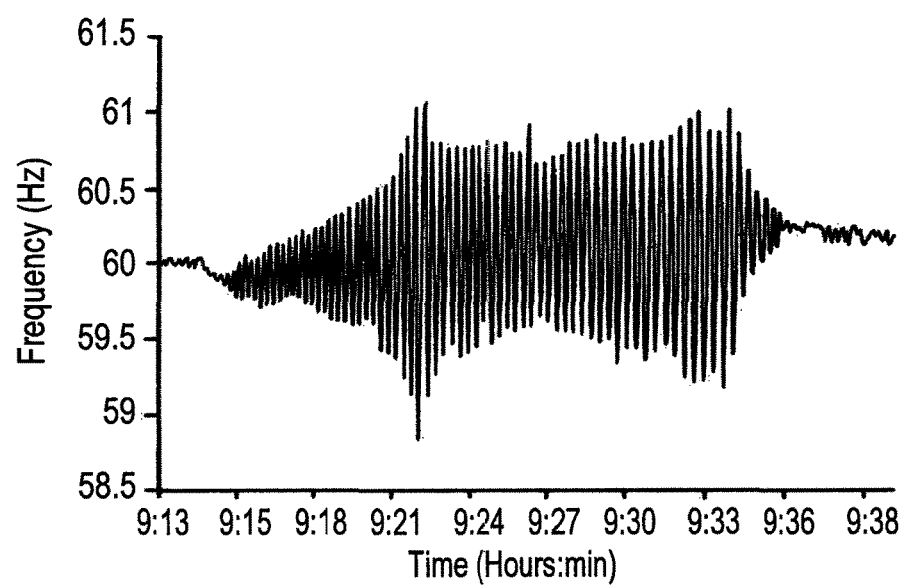
FIG. 1 is a graph of grid frequency over time which shows the effects of grid oscillation.

A graph of grid frequency over time which shows the effects of grid oscillation is shown in FIG. 1. FIG. 1 is described above.

Figure 2:
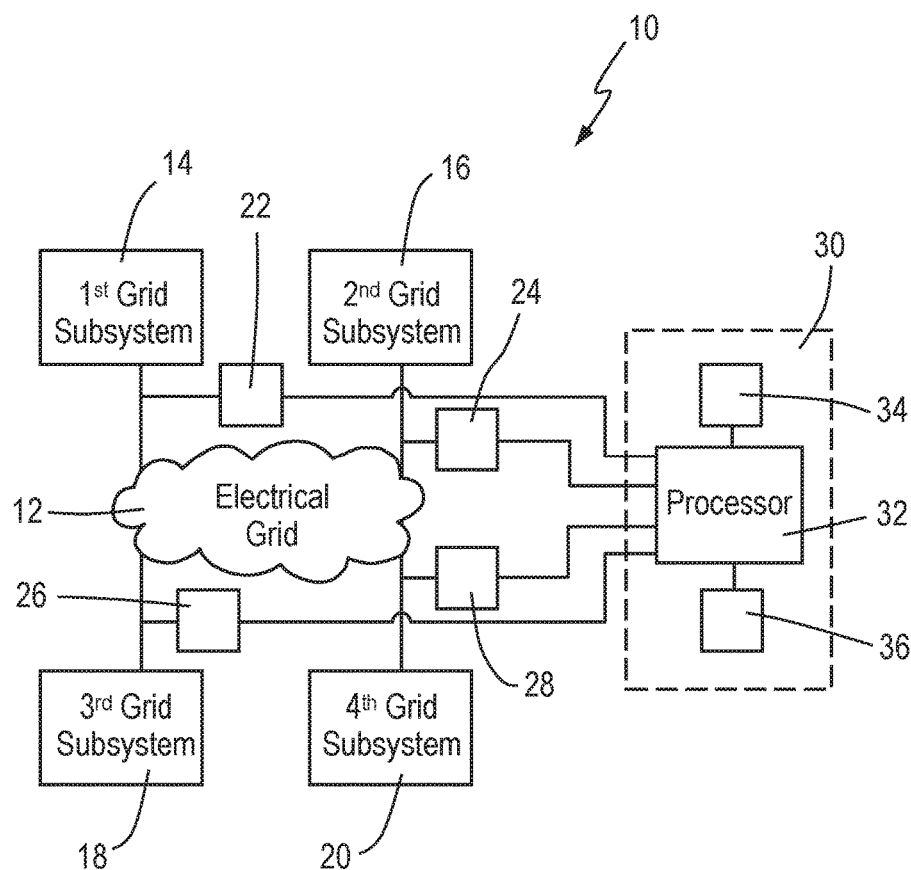
FIG. 2 is a block diagram representation of apparatus according to the present invention.

A block diagram representation of apparatus 10 according to the present invention is shown in FIG. 2. The apparatus 10 comprises an electrical grid 12 which is operative at power transmission system voltage levels, such as at 132 kV, 220 kV or 400 kV or perhaps less commonly at 750 kV. First, second, third and fourth grid subsystems 14, 16, 18, 20 are electrically connected to the electrical grid 12. Each of the grid subsystems 14, 16, 18, 20 contributes electrical power to the grid and thus comprises a generator and whatever further local apparatus may be required, such as a step-up transformer. Alternatively one or more of the grid subsystems 14, 16, 18, 20 is a section of the grid comprising plural generators and loads that are electrically interconnected. First, second, third and fourth Phasor Measurement Units (PMUs) 22, 24, 26, 28 are provided at a respective one of the first to fourth grid subsystems 14, 16, 18, 20 whereby a PMU is operative to make measurements at or near the point of connection of its respective grid subsystem to the electrical grid 12. Each of the PMUs is an Alstom P847 from Alstom Grid of St. Leonards Avenue, ST17 4LX, Stafford, United Kingdom. The PMUs are synchronised with one another either of themselves or by way of an external time reference, such as from a GPS time source. The apparatus further comprises computing apparatus 30, which in turn comprises a processor 32, data storage 34 and an output device 36. The computing apparatus 30 and its components will be of a form and function familiar to the skilled reader. The output device 36 of the computing apparatus 30 is operative under control of the processor 32 to display data to a user of the computing apparatus 30. The computing apparatus 30 is operative to receive measurements made by the first to fourth PMUs 22, 24, 26, 28. Measurements are received by the computing apparatus 30 by way of a communications channel between the computing apparatus 30 and each PMU with the communications channel being of a copper, optical fibre or wireless form.

Figure 3A:
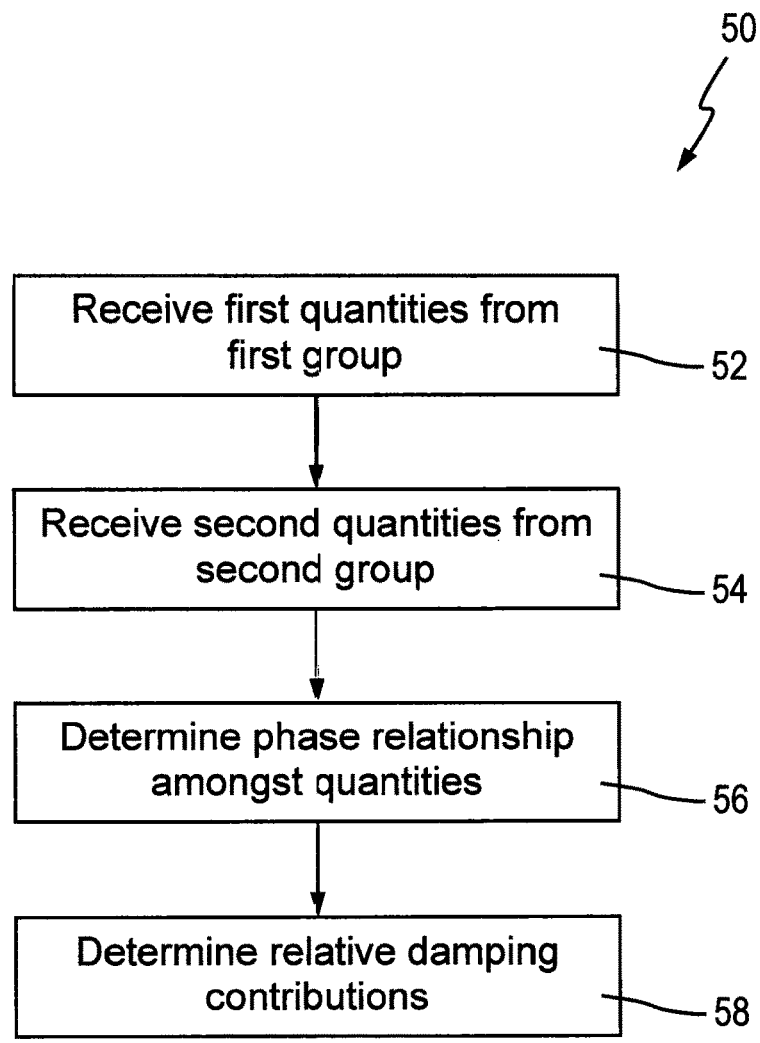
FIG. 3A is a flow chart representation of a method according to a first embodiment of the present invention.
Figure 7:
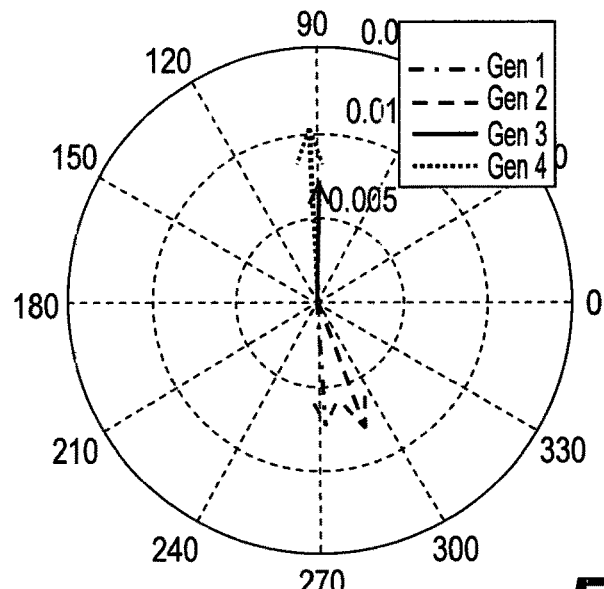
FIG. 7 is a compass plot for an inter-area mode.

The operation of the apparatus 10 of FIG. 2 will now be described with reference to flow charts shown in FIGS. 3A to 3B. FIG. 3A is a flow chart representation 50 of how determinations are made with regards to relative damping contributions where there are two groups of generators oscillating in accordance with an inter-area mode. As is described above the inter-area mode is characterised by opposing oscillations, i.e. oscillations which are substantially 180° out of phase. As a first step 52, first quantities are received in the computing apparatus 30 from a first group which consists of first and second generators comprised in the first and second grid subsystems 14, 16. As a second step 54, second quantities are received in the computing apparatus 30 from a second group which consists of third and fourth generators comprised in the third and fourth grid subsystems 18, 20. The first and second quantities are based on a same or different measurable property such as angle or frequency. Furthermore the quantities, whether they are based on the same or different measurable properties, correspond to oscillations in angle as reflected in the measurable property. Calculation of the quantities on the basis of actual measurements made by the PMUs is normally in a processor 32 in the form of a Wide Area Monitoring System (WAMS) on the basis of unprocessed measurements received from the PMUs. The processor is operative on the PMU measurements to provide oscillation frequency, oscillation amplitude, damping and phase. The determination of these quantities will be familiar to the notionally skilled reader and is described in IEEE Task Force Report TP462 "Identification of Electromechanical Modes in Power Systems", June 2012. Alternatively but less frequently the quantities are calculated in the PMUs themselves. The next step 56 involves determining a phase relationship amongst the first and second quantities which is carried out in the processor 32. FIG. 7 is a compass plot for the four generators for a specific frequency of oscillation. As can be seen from FIG. 7 the first group of first and second generators lags the second group of third and fourth generators by an angle of less than the ideal case of 180°. The processor 32 is operative to determine this phase relationship. The next step 58 involves determining the relative damping contributions on the basis of the determined phase relationship. The lagging of the first group by the second group by an angle of less than 180° is indicative of the first group contributing more damping than the second group. Accordingly the processor 32 is operative on the basis of the determined phase relationship to determine that the first group contributes more damping and the second group contributes less damping. Considering the first group more closely and as shown in FIG. 7 the first generator lags the second generator which indicates that the first generator contributes the more damping within the first group. The processor 32 is accordingly operative on the determined phase relationships to determine that of the first and second generators the first generator contributes the more damping. Where the electrical grid 12 is exhibiting undesirable oscillatory behaviour, an operator can then address the problem in view of the determination made with regards to relative damping contributions. For example the operator can then take action by adjusting dispatched operating points or by isolating faulty equipment on the basis of the determined relative damping contributions. As will be appreciated, under certain circumstances relative damping contributions of generators can be determined in a straightforward manner on the basis of their phase relationship, such as when generators in a group are oscillating in the same direction. Otherwise a more sophisticated approach is required to take account of more complex oscillatory behaviour which is characteristic of the like of inter-area and local modes. Such a more sophisticated approach is described below with reference to FIG. 3B. Furthermore and according to certain embodiments a more precise determination of damping contributions can be made where there is further characterisation of the grid subsystems and the electrical grid.

Figure 3B:
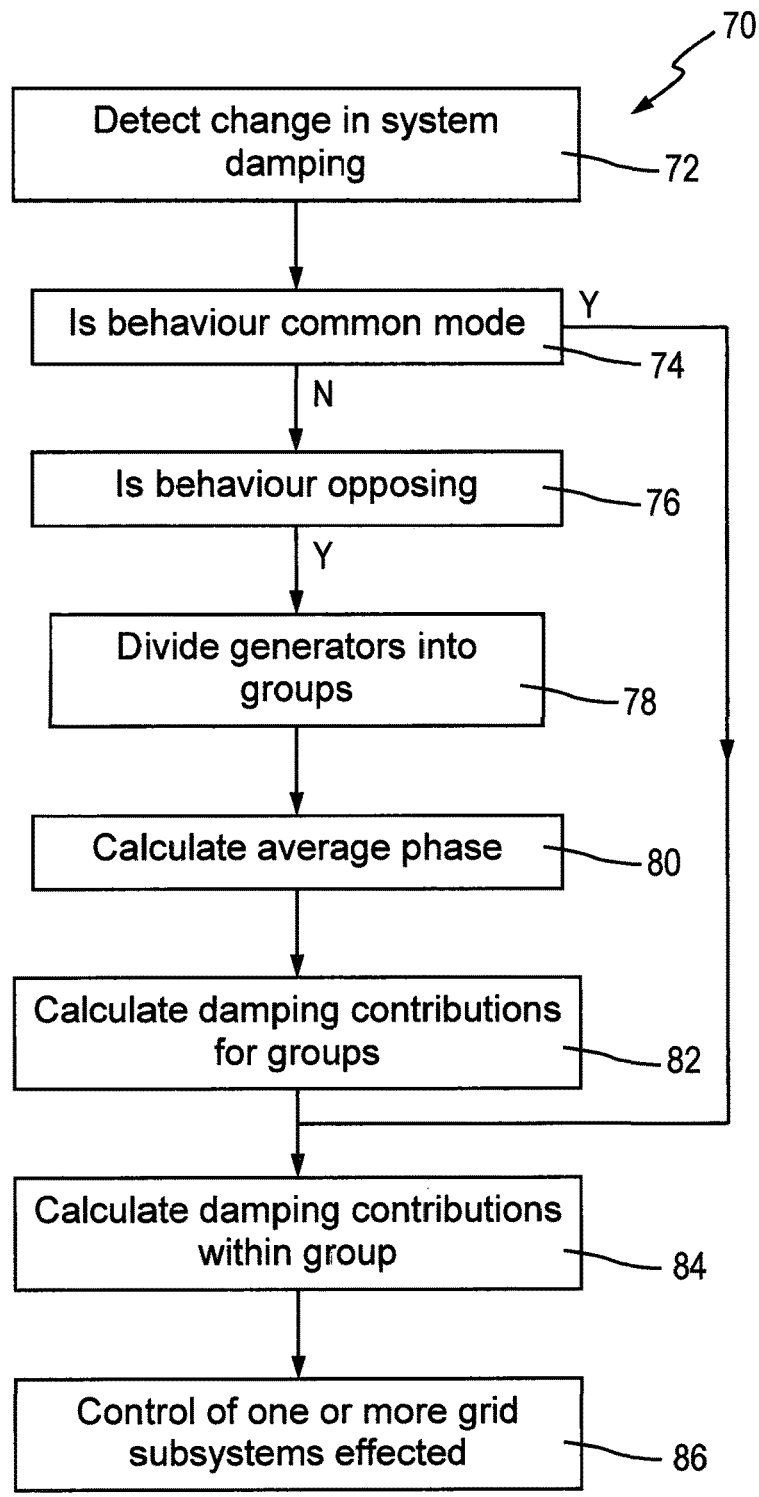
FIG. 3B is a flow chart representation of a method according to a second embodiment of the present invention.
Figure 4:
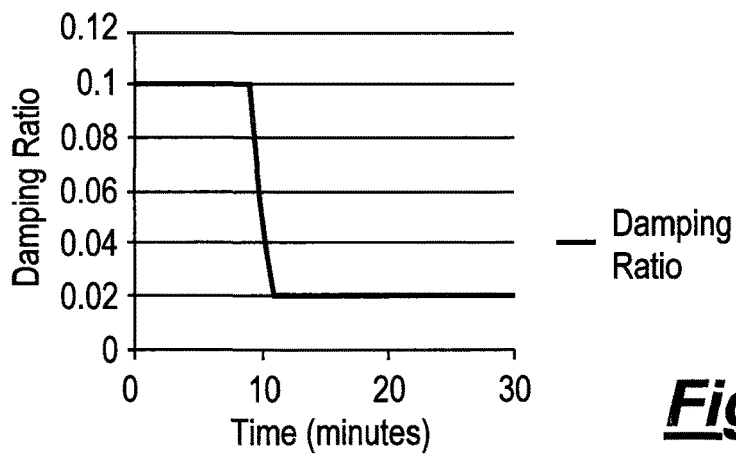
FIG. 4 is a plot of damping ratio for an oscillatory mode which has changed from well damped to poorly damped.

FIG. 3B is a flow chart representation 70 of how determinations are made with regards to damping contributions amongst plural generators. As a first step 72 a change in damping is detected. The change in damping is detected on the basis of measurements made in the electrical grid 12 over time. The measurements should provide an indication of overall system behaviour and are, if appropriate, provided by one or more of the first PMUs 22, 24, 26, 28. Alternatively one or more measurements elsewhere within the electric grid 12 are used to detect a change in damping. FIG. 4 shows a significant change in damping ratio within an electrical grid from a well damped condition to a lightly damped condition. If there has been a change in oscillatory behaviour that warrants intervention the oscillatory mode is then determined. Therefore according to a next step 74, system behaviour is analysed to determine whether or not there is common mode oscillation. According to a first approach measured oscillation frequency is compared to a first threshold frequency of 0.1 Hz and if the measured oscillation frequency is less than the first threshold frequency common mode oscillatory behaviour is determined. According to a second approach amplitudes of oscillation in different parts of the electrical grid are compared and if the amplitudes are substantially or generally the same common mode oscillatory behaviour is determined. If common mode oscillatory behaviour is determined the method proceeds to step 84, which is described below. Otherwise the next step 76 is analysis of system behaviour to determine if oscillations in angle are opposing, e.g. as is characteristic of a local mode or an inter-area mode. According to a first approach measured oscillation frequency is compared to a second threshold frequency of 0.2 Hz and if the measured oscillation frequency is more than the second threshold frequency, opposing oscillatory behaviour is determined. According to a second approach amplitudes of oscillation in different parts of the electrical grid are compared and if the amplitudes are significantly different opposing oscillatory behaviour is determined.

If opposing oscillatory behaviour is determined the next step 78 is dividing the grid subsystems or generators into groups. According to a first approach the grid subsystems are divided into groups in dependence on their electrical separateness. More specifically this involves analysing measurements, such as current measurements, made in the electrical grid, for example by the first to fourth PMUs 22, 24, 26, 28 and/or other measurement apparatus operative to make measurements elsewhere in the electrical grid. According to a second approach the grid subsystems are divided into groups in dependence on the relative directions of oscillations of the grid subsystems. More specifically the second approach involves determining a direction of oscillation of each grid subsystem and dividing the plural grid subsystems into groups in dependence on the determined directions. The directions of oscillation are determined by analysis of oscillation measurements, such as measurements made by the first to fourth PMUs 22, 24, 26, 28 and/or other measurements made by measurement apparatus elsewhere in the electrical grid. In certain embodiments the first and second approaches are used together. According to such embodiments the second approach is used initially and the first approach is then used, if necessary, to address the like of conflicts or ambiguities arising from use of the second approach. A further alternative approach involves grouping grid subsystems in dependence on knowledge, e.g. in the form of machine readable data, of the configuration of the electrical grid.

When the grid subsystems have been grouped, the next step 80 is determination of an average phase angle for each group. The average phase angle is determined on the basis of the received quantities (as per boxes 52 and 54 in FIG. 3A) for the grid subsystems or generators comprised in each group. Where ratings for generators within a group differ significantly, the average phase is weighted in dependence on the ratings of the individual generators. Thereafter the damping contribution for each group is calculated 82. The damping contribution for each group is given by:

$$D_{Gi} = \sum_{j=1}^{n} w_{ij} * a_{Gj} * \sin(\theta_{Gj} - \theta_{Gi})$$

where $D_{Gi}$ is the damping contribution of group i, $w_{ij}$ is the sensitivity of group i to group j, $a_{Gj}$ is the average amplitude for group j, $\theta_{Gj}$ is the average oscillation phase angle for group j and $\theta_{Gi}$ is the average oscillation phase angle for group i. The derivation of and basis for the above equation is provided in the Appendix below. Considering the above equation further, the average phase angle for appropriate groups is provided by the previous step. The average amplitude for a group is determined on the basis of amplitude measurements provided by the appropriate PMUs. The sensitivity factor $w_{ij}$ is determined in dependence on electrical distance between the two groups in question and the ratings of the generators. According to another approach the sensitivity factor is determined by way of a model of the power system. For example and in a power system comprising first to fourth generators, sensitivity factors for the first generator $w_{i1}$ are determined by increasing the output of the first generator by a small amount, such as 1 MW, and calculating the changes in the other generators by way of the model, with each of the three sensitivity factors $w_{i1}$ being given by $$-\frac{\partial P_i}{\partial \delta_1}.$$

Figure 5:
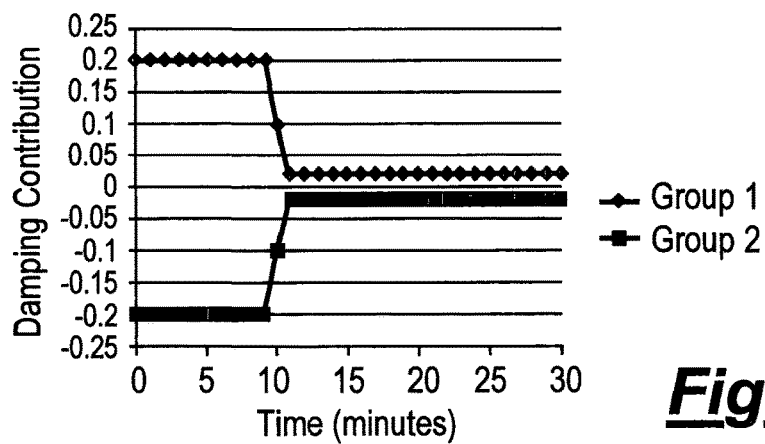
FIG. 5 is a plot of the damping contributions of two groups.

The same process is then performed in respect of each of the second to fourth generators to thereby provide a set of three sensitivity factors for each of the second to fourth generators. Where required by circumstances, the same approach is applied to groups of generators by modelling each group as one large generator. When an inter-group sensitivity is changed on account of a change in the configuration of the electrical grid the appropriate factor is changed. Upon the conclusion of the present step 82 the damping contributions of the groups are analysed to identify groups which are contributing in a positive fashion to grid oscillation, contributing in a negative fashion to grid oscillation and merely responding to grid oscillation. FIG. 5 is a plot of the damping contributions of two groups which reflect the reduction in damping evident from FIG. 4. As can be seen from FIG. 5 there is a reduction in damping contribution from group 1 and an increase in damping contribution from group 2 whereby it is determined that group 1 is responsible for the reduction in damping seen in FIG. 4.

Figure 6:
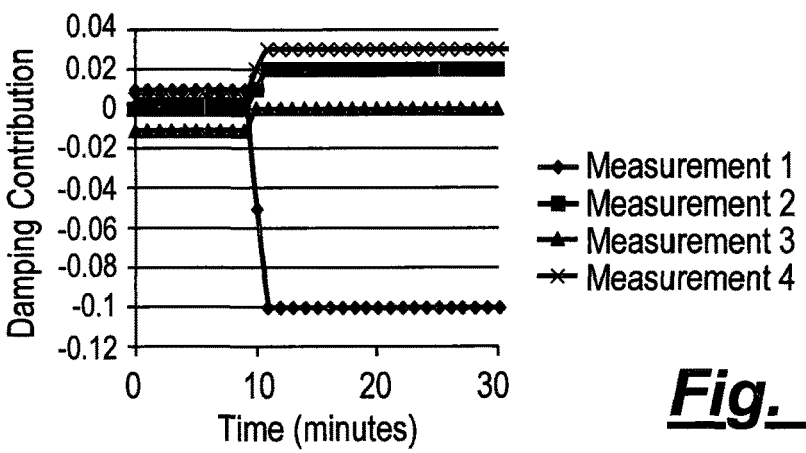
FIG. 6 is a plot of the damping contributions of individual grid subsystems.

The following step 84 comprises calculating the damping contributions within at least one of the groups formed at step 78. Depending on circumstances and requirements, damping contributions within a dominant group only are calculated. In other circumstances damping contributions within several groups are calculated. As mentioned above, where a determination of common mode oscillation is made in step 74 of the method the next step is the present step. Where a determination of common mode oscillation is made all the grid subsystems or generators are considered as belonging to one group. In the present step 84 the damping contribution for grid subsystem or generator within the group is calculated on the basis of:

$$D_i = \sin(\theta_G - \theta_i)$$

where $D_i$ is the damping contribution at grid subsystem i, $\theta_i$ is the phase angle of oscillations at grid subsystem i and $\theta_G$ is the average oscillation phase angle for the grid subsystems within the group. Damping contributions within a group and/or at group level are displayed to an operator by way of the output device 36 of the computing apparatus 30 in a numerical or graphical form so as to provide for ease of interpretation of contributory behaviour. FIG. 6 is a plot of the damping contributions of individual grid subsystems within group 1 of FIG. 5 which reflect the reduction in damping evident from FIG. 4. As can be seen from FIG. 6 measurement 1, which is made in respect of a first generator, shows a large reduction in damping contribution whereas the other measurements show a small increase in damping contribution whereby it is determined that the first generator is responsible for the reduction in damping seen in FIG. 4.

Figure 8:
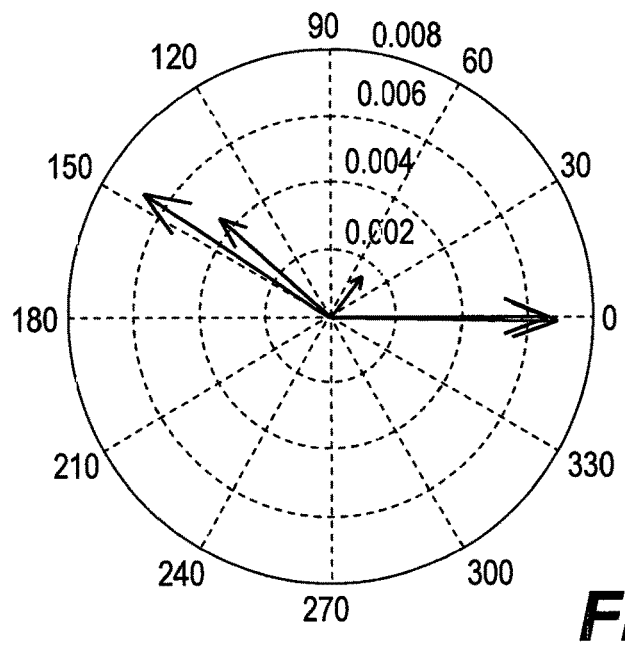
FIG. 8 is a compass plot for a well damped inter-area mode.
Figure 9:
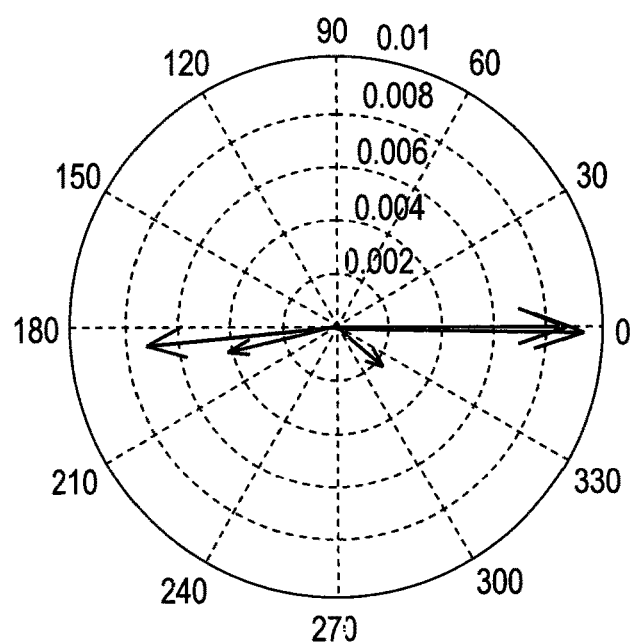
FIG. 9 is a compass plot for a lightly damped inter-area mode.

Considering the analysis of damping contributions at the group level, where there is an increase in damping, the group having the greatest increase in phase relative the others groups (i.e. involving anti-clockwise rotation relative the other groups) is identified. The identified group is responsible or is the most responsible for the increase in damping. Group contributions are compared with reference contributions which are either based on earlier measurements or reference conditions, such as are provided by simulation or calculation to reflect ideal, well damped conditions. Normally the latter approach is preferred because it tends to yield better results on account of a greater extent of difference and perhaps also additional useful data depending on the nature of the reference conditions. In certain embodiments this approach is expanded to identify a second group having a second greatest increase in relative phase and so on whereby contributions from several groups and their relative extent of contribution are determined. Turning now to the grid subsystem or generator level, the grid subsystem within a particular group which has the greatest decrease in phase relative the other grid subsystems is identified. Contributions at grid subsystem level are compared with reference contributions. The identified grid subsystem within the identified group is responsible or is the most responsible for the increase in damping. Similarly in certain embodiments this approach is expanded to identify a second grid subsystem having a second greatest decrease in relative phase and so on whereby contributions from several grid subsystems and their relative extent of contribution are determined. The effect at the group level is illustrated by way of FIGS. 8 and 9 which show compass plots for an inter-area mode, which changes from the well damped condition reflected in FIG. 8 to a lightly damped condition reflected in FIG. 9. As can be seen, the group with oscillations near 0° is responsible for the reduction in damping as the group which shows a reduction in phase angle.

Considering further the analysis of damping contributions at the group level but now where there is decrease in damping, the group having the greatest reduction in phase relative the others groups (i.e. involving clockwise rotation relative the other groups) is identified. The identified group is responsible or is the most responsible for the decrease in damping. In certain embodiments this approach is expanded to identify a second group having a second greatest reduction in relative phase and so on whereby contributions from several groups and their relative extent of contribution are determined. Turning now to the grid subsystem or generator level, the grid subsystem within a particular group which has the greatest increase in phase relative the other grid subsystems is identified. The identified grid subsystem within the identified group is responsible or is the most responsible for the decrease in damping. Similarly in certain embodiments this approach is expanded to identify a second grid subsystem having a second greatest increase in relative phase and so on whereby contributions from several grid subsystems and their relative extent of contribution are determined.

Returning to FIG. 3B control of one or more grid subsystems is then effected 86, such as by way of adjusting dispatched operating points or by isolating faulty equipment, to address problematic oscillatory behaviour in the electrical grid. Alternatively the present invention is applied to provide feedback on the effect of a control strategy. For example the damping effect of a generator may be increased and reduced by tuning of its controller and the wider effect of the tuning on system stability determined by way of the present invention.

Appendix

A second order system is the simplest dynamic system that can have oscillations.

The behaviour of a second order system can be described by the following differential equation:

$$\ddot{x} + 2\zeta\omega_n \dot{x} + \omega_n^2 x = 0 \quad \text{(a)}$$

where x is displacement, $\omega_n$ is speed and $\zeta$ is the damping ratio.

A generator-infinite bus system can be approximated by a second order model. Here x is the generator angle δ. Assuming constant mechanical power, the second order model can be expressed as:

$$\ddot{\delta} = \frac{1}{2H}(-\Delta P) \quad \text{(b)}$$

where H is the inertial constant and P is power.

If the voltage is constant and the generator has no damping ΔP is proportional to the change in the generator angle δ as defined by:

$$\Delta P = V_1 V_2 \frac{\cos\delta_0}{X} \Delta\delta \quad \text{(c)}$$

where $V_1$ and $V_2$ are voltage signals on the two buses and X is impedance.

In the present case the eigenvalue has a zero real part.

To find the phase relationship between angle and speed oscillations we assume the angle oscillation is given by the following equation:

$$x = e^{\lambda t} \quad \text{(d)}$$

where λ is the eigenvalue. The derivative of this equation is shifted from x by an angle equal to the angle of the complex number λ. The derivative is given by the following equation:

$$\dot{x} = \lambda e^{\lambda t} \quad \text{(e)}$$

Where the eigenvalue has a zero real part, $\lambda = j\omega_n$ and $\dot{x}$ leads x by 90°.

For a damping ratio of 20% the derivative leads by 101°. For most observable oscillation modes the angle difference deviates little from 90°.

Figure 10A:
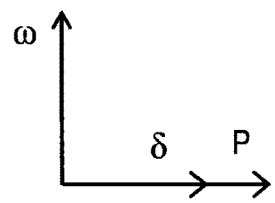
FIG. 10A is a vector plot of oscillations for an un-damped mode.
Figure 10B:
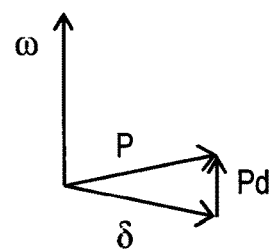
FIG. 10B is a vector plot of oscillations for a damped mode.
Figure 10C:
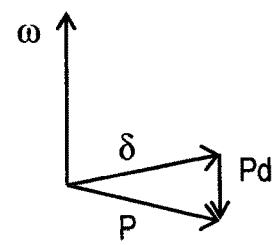
FIG. 10C is a vector plot of oscillations for a negatively damped mode.

For a single generator the speed, power and angle oscillations can be represented by vectors as shown in FIG. 10A. In this case power P and the generator angle δ are in phase, as expected from equation (c) and both lag the speed by 90°. For a damped mode where damping is provided by electrical power, the electrical power has a component in phase with the speed as shown in FIG. 10B. The damping power component Pd may, for example, result from the generator's voltage controller. The phase relationship for a negatively damped mode where Pd is in the opposite direction is shown in FIG. 10C.

Figure 11A:
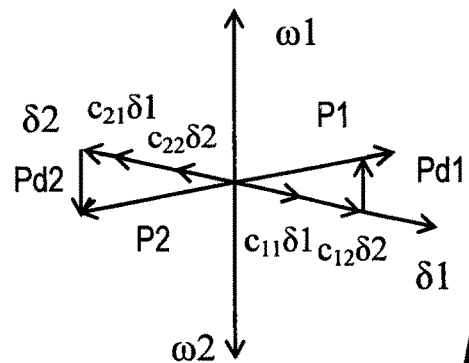
FIG. 11A is a vector plot for two generators with identical damping.

In a system with two generators the power of each generator is a function of the angle of both generators and more specifically of the difference between the two angles. As is shown in FIG. 11A the oscillations are 180° out of phase for two generators with identical damping. If one of the generators has a larger damping component the generator with the greater damping contributes positive damping to the other generator. The generator with less damping has a negative effect on the greater damped generator. As a consequence the damping of the mode is the same for the whole system on account of the interaction between the two generators. This causes the phase shift between the oscillations to differ from 180° as is shown in FIG. 11B.

Figure 11B:
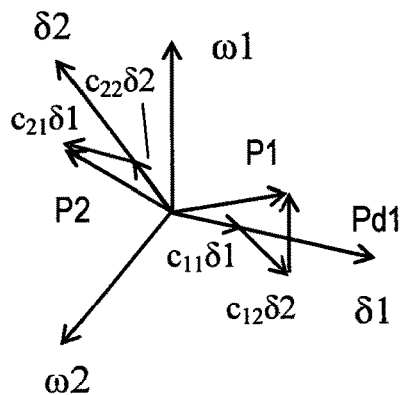
FIG. 11B is a vector plot for two generators with one generator only providing damping.
Figure 11C:
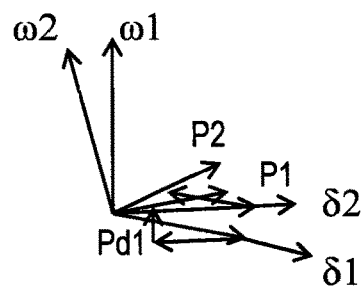
FIG. 11C is a vector plot for two generators with both generators oscillating in the same direction.

A system having two generators which are oscillating in the same direction is shown in FIG. 11C.

In both FIGS. 11B and C generator 1 contributes more damping than generator 2. As a result of the phase angle differences the angle oscillations in generator 2 have a component which is perpendicular to the oscillations in generator 1. This perpendicular component is proportional to the sine of the angle difference and causes an increase in the damping contribution of generator 1 compared to the case of FIG. 11A where there is equal damping. This can be expanded to cover a larger number of generators by adding the effect of all generators on generator 1 to thereby calculate the increase in damping provided by a generator compared to the reference case where all generators provide the same amount of damping. The damping contribution for each generator is defined as:

$$D_i = \sum_{j=1}^{n} c_{ij} * a_j * \sin(\theta_j - \theta_i) \tag{f}$$

where $D_i$ is the damping contribution of generator i, $a_j$ is the amplitude of the angle oscillations at generator j, $\theta_j$ is the phase angle of the oscillations at generator j, $\theta_i$ is the phase angle of the oscillations at generator i and $c_{ij}$ is the reduction in the power output of generator i for a small increase in the angle at generator j, where $$c_{ij} = -\frac{\partial P_i}{\partial \delta_j}.$$

The invention claimed is:

1. A method of determining a contribution of at least one grid subsystem of plural grid subsystems to oscillation in angle or grid oscillation in an electrical grid, the method comprising:
receiving a first quantity which corresponds to oscillation in angle at a first grid subsystem;
receiving a second quantity which corresponds to oscillation in angle at a second grid subsystem, the first and second quantities being based on a same measured property; and
determining a contribution of at least one of the first and second grid subsystems to oscillation in angle or grid oscillation, the contribution being determined in dependence on a phase relationship between the received first and second quantities,
wherein determining the contribution comprises calculating a contribution of at least one of the first and second grid subsystems, wherein the contribution is calculated in dependence on a sine of a difference between the phases of the first and second quantities, and wherein plural such contributions are determined, comparing the plural contributions to thereby determine relative extents of contribution of plural grid subsystems.

2. The method according to claim 1 wherein the same measured property is one of frequency, angle and power.

3. The method according to claim 1 wherein determining the contribution comprises determining relative contributions of the first and second grid subsystems to oscillation in angle, the step of determining relative contributions comprising determining relative damping contributions of the first and second grid subsystems to oscillation in angle.

4. The method according to claim 1 further comprising comparing the contribution of at least one of the first and second grid subsystems with a respective reference contribution.

5. A computer program product comprising program instructions for causing a computer to perform the method according to claim 1.

6. The computer program product according to claim 5 which is one of: embodied on a record medium; embodied in a read only memory; and stored in a computer memory.

7. The method according to claim 1 wherein at least one of the first and second quantities is received by way of processing apparatus from measurement apparatus.

8. The method according to claim 7 wherein the measurement apparatus comprises at least one phasor measurement unit (PMU).

9. A method of determining a contribution of at least one grid subsystem of plural grid subsystems to oscillation in angle or grid oscillation in an electrical grid, the method comprising:
receiving a first quantity which corresponds to oscillation in angle at a first grid subsystem;
receiving a second quantity which corresponds to oscillation in angle at a second grid subsystem, the first and second quantities being based on a same measured property; and
determining a contribution of at least one of the first and second grid subsystems to oscillation in angle or grid oscillation, the contribution being determined in dependence on a phase relationship between the received first and second quantities,
wherein determining the contribution comprises determining whether or not there is a change in oscillation in angle, and
wherein at least one of temporally spaced apart first quantities corresponding to characteristics of oscillation in angle and temporally spaced apart second quantities corresponding to characteristics of oscillation in angle are received, the change in oscillation in angle being determined in dependence on the received at least one of temporally spaced apart first quantities and temporally spaced apart second quantities.

10. A method of determining a contribution of at least one grid subsystem of plural grid subsystems to oscillation in angle or grid oscillation in an electrical grid, the method comprising:
dividing plural grid subsystems into plural groups in dependence on phase relationships of oscillations of the plural grid subsystems;
determining a group phase for each of the plural groups; and
calculating a contribution of at least one group of the plural groups in dependence on relationships between the group phases of the plural groups, and
wherein for at least one of the plural groups:
receiving a first quantity which corresponds to oscillation in angle at a first grid subsystem in said at least one of the plural groups;
receiving a second quantity which corresponds to oscillation in angle at a second grid subsystem in said at least one of the plural groups, the first and second quantities being based on a same measured property; and
determining a contribution of at least one of the first and second grid subsystems to oscillation in angle or grid oscillation, the contribution being determined in dependence on a phase relationship between the received first and second quantities.

11. The method according to claim 10 further comprising determining a contribution of at least one grid subsystem in a group.

12. The method according to claim 10 wherein there is an increase in damping, the method further comprising identifying one of the plural groups as having a greatest increase in phase relative to others of the plural groups with opposing oscillations.

13. The method according to claim 12 wherein the identified group comprises plural grid subsystems, the method further comprising identifying one of the plural grid subsystems within the identified group as having a greatest reduction in phase relative the other grid subsystems in the identified group.

14. The method according to claim 9 wherein the same measured property is one of frequency, angle and power.

15. The method according to claim 9 wherein determining the contribution comprises determining relative contributions of the first and second grid subsystems to oscillation in angle, the step of determining relative contributions comprising determining relative damping contributions of the first and second grid subsystems to oscillation in angle.

16. A computer program product comprising program instructions for causing a computer to perform the method according to claim 9.

17. The method according to claim 10 wherein there are at least three groups, the method further comprising adjusting a difference between group phases between a first group and each of second and further groups in dependence on at least one of: an amplitude for one of the groups; and a sensitivity of the first group to a change in a respective second or further group.

18. The method according to claim 10 wherein the plural grid subsystems are divided into groups in dependence on electrical separateness of the plural grid subsystems.

19. The method according to claim 10 wherein there is a decrease in damping, the method further comprising identifying one of the plural groups as having a greatest reduction in phase relative to others of the plural groups with opposing oscillations.

20. The method according to claim 19 wherein the identified group comprises plural grid subsystems, the method further comprising identifying one of the plural grid subsystems within the identified group as having a greatest increase in phase relative to the other grid subsystems in the identified group.

21. The method according to claim 10 wherein the same measured property is one of frequency, angle and power.

22. A computer program product comprising program instructions for causing a computer to perform the method according to claim 10.

23. Apparatus for determining a contribution of at least one grid subsystem of plural grid subsystems to oscillation in angle or grid oscillation in an electrical grid, the apparatus being configured to:
  receive a first quantity which corresponds to oscillation in angle at a first grid subsystem;
  receive a second quantity which corresponds to oscillation in angle at a second grid subsystem, the first and second quantities being based on a same measured property, wherein the apparatus comprises a processor which is operative to determine a contribution of at least one of the first and second grid subsystems to oscillation in angle or grid oscillation, the contribution being determined in dependence on a phase relationship between the first and second quantities,
  wherein determining the contribution comprises calculating a contribution of at least one of the first and second grid subsystems, wherein the contribution is calculated in dependence on a sine of a difference between the phases of the first and second quantities, and wherein plural such contributions are determined, comparing the plural contributions to thereby determine relative extents of contribution of plural grid subsystems.

24. An electrical grid comprising apparatus according to claim 23.

25. Apparatus for determining a contribution of at least one grid subsystem of plural grid subsystems to oscillation in angle or grid oscillation in an electrical grid, the apparatus being configured to:
  receive a first quantity which corresponds to oscillation in angle at a first grid subsystem;
  receive a second quantity which corresponds to oscillation in angle at a second grid subsystem, the first and second quantities being based on a same measured property, wherein the apparatus comprises a processor which is operative to determine a contribution of at least one of the first and second grid subsystems to oscillation in angle or grid oscillation, the contribution being determined in dependence on a phase relationship between the first and second quantities,
  wherein determining the contribution comprises determining whether or not there is a change in oscillation in angle, and
  wherein at least one of temporally spaced apart first quantities corresponding to characteristics of oscillation in angle and temporally spaced apart second quantities corresponding to characteristics of oscillation in angle are received, the change in oscillation in angle being determined in dependence on the received at least one of temporally spaced apart first quantities and temporally spaced apart second quantities.

26. An electrical grid comprising apparatus according to claim 25.

27. Apparatus for determining a contribution of at least one grid subsystem of plural grid subsystems to oscillation in angle or grid oscillation in an electrical grid, the apparatus being configured to:
  divide plural grid subsystems into plural groups in dependence on phase relationships of oscillations of the plural grid subsystems;
  determine a group phase for each of the plural groups; and
  calculate a contribution of at least one group of the plural groups in dependence on relationships between the group phases of the plural groups, and
  wherein for at least one of the plural groups:
    receive a first quantity which corresponds to oscillation in angle at a first grid subsystem in said at least one of the plural groups; and
    receive a second quantity which corresponds to oscillation in angle at a second grid subsystem in said at least one of the plural groups, the first and second quantities being based on a same measured property, wherein the apparatus comprises a processor which is operative to determine a contribution of at least one of the first and second grid subsystems to oscillation in angle or grid oscillation, the contribution being determined in dependence on a phase relationship between the first and second quantities.

28. An electrical grid comprising apparatus according to claim 27.

* * * * *